US007025619B2

(12) United States Patent
Tsui et al.

(10) Patent No.: US 7,025,619 B2
(45) Date of Patent: Apr. 11, 2006

(54) SOCKETS FOR MICROASSEMBLY

(75) Inventors: Kenneth Tsui, Richardson, TX (US);
Aaron Geisberger, Dallas, TX (US)

(73) Assignee: ZYVEX Corporation, Richardson, TX (US)

( * ) Notice: Subject to any disclaimer, the term of this patent is extended or adjusted under 35 U.S.C. 154(b) by 0 days.

(21) Appl. No.: 11/074,448

(22) Filed: Mar. 8, 2005

(65) Prior Publication Data
US 2005/0181636 A1 Aug. 18, 2005

Related U.S. Application Data

(63) Continuation-in-part of application No. 10/778,460, filed on Feb. 13, 2004, now Pat. No. 6,923,669.

(51) Int. Cl.
*H01R 13/627* (2006.01)
(52) U.S. Cl. ..................................... 439/353
(58) Field of Classification Search ............... 439/350, 439/351, 353, 357
See application file for complete search history.

(56) References Cited

U.S. PATENT DOCUMENTS

| 3,268,774 A | 8/1966 | Ortner |
| 3,439,416 A | 4/1969 | Yando |
| 3,467,942 A | 9/1969 | Dell et al. |
| 3,588,618 A | 6/1971 | Otte |
| 4,018,409 A | 4/1977 | Burch et al. |
| 4,141,138 A | 2/1979 | Quick |
| 4,383,195 A | 5/1983 | Kolm et al. |
| 4,740,410 A | 4/1988 | Muller |
| 4,852,242 A | 8/1989 | Tella et al. |
| 4,911,098 A | 3/1990 | Tabata |
| 4,955,814 A | 9/1990 | Christie et al. |
| 4,963,748 A | 10/1990 | Szilagyi |
| 4,969,827 A | 11/1990 | Hahs, Jr. |
| 5,025,346 A | 6/1991 | Tang et al. |
| 5,072,288 A | 12/1991 | MacDonald et al. |
| 5,092,781 A | 3/1992 | Casciotti et al. |
| 5,113,117 A | 5/1992 | Brooks et al. |
| 5,122,663 A | 6/1992 | Chang et al. |
| 5,160,877 A | 11/1992 | Fujiwara et al. |
| 5,215,923 A | 6/1993 | Kinoshita et al. |
| 5,273,441 A | 12/1993 | Volz et al. |
| 5,399,415 A | 3/1995 | Chen et al. |
| 5,411,400 A | 5/1995 | Subrahmanyan et al. |
| 5,538,305 A | 7/1996 | Conway et al. |
| 5,539,200 A | 7/1996 | Lebby et al. |
| 5,610,335 A | 3/1997 | Shaw et al. |

(Continued)

FOREIGN PATENT DOCUMENTS

DE 19746585 4/1999

(Continued)

OTHER PUBLICATIONS

Dechev et al., "Microassembly of 3-D Microstructure Using a Compliant, Passive Microgripper," Journal of Microelectromechanical Systems, vol. 13, No. 2, Apr. 2004, pp. 176-189.

(Continued)

*Primary Examiner*—Ross Gushi
(74) *Attorney, Agent, or Firm*—Haynes and Boone, LLP

(57) ABSTRACT

An apparatus including at least three deflectable members each configured to deflect during assembly with a component, and also configured to remain in contact with the component after assembly with the component. At least one of the deflectable members and the component has a thickness not greater than about 1000 microns.

20 Claims, 11 Drawing Sheets

U.S. PATENT DOCUMENTS

| | | | |
|---|---|---|---|
| 5,645,684 | A | 7/1997 | Keller |
| 5,657,516 | A | 8/1997 | Berg et al. |
| 5,660,680 | A | 8/1997 | Keller |
| 5,746,621 | A | 5/1998 | Cronin |
| 5,774,956 | A * | 7/1998 | French et al. ................ 24/625 |
| 5,806,152 | A | 9/1998 | Saitou |
| 5,818,748 | A | 10/1998 | Bertin |
| 5,848,456 | A | 12/1998 | Sjoqvist |
| 5,867,302 | A | 2/1999 | Fleming |
| 5,895,084 | A | 4/1999 | Mauro |
| 5,963,788 | A | 10/1999 | Barron et al. |
| 6,103,399 | A | 8/2000 | Smela et al. |
| 6,131,277 | A | 10/2000 | Cadenhead et al. |
| 6,154,936 | A | 12/2000 | Howell et al. |
| 6,193,139 | B1 | 2/2001 | Kivilahti |
| 6,193,541 | B1 | 2/2001 | Lee |
| 6,215,081 | B1 | 4/2001 | Jensen et al. |
| 6,218,664 | B1 | 4/2001 | Krans et al. |
| 6,219,254 | B1 | 4/2001 | Akerling et al. |
| 6,239,685 | B1 | 5/2001 | Albrecht et al. |
| 6,257,925 | B1 | 7/2001 | Jones |
| 6,263,549 | B1 | 7/2001 | Uehara |
| 6,300,156 | B1 | 10/2001 | Decker et al. |
| 6,303,885 | B1 | 10/2001 | Hichwa et al. |
| 6,321,654 | B1 | 11/2001 | Robinson |
| 6,396,711 | B1 | 5/2002 | Degani et al. |
| 6,398,280 | B1 | 6/2002 | Parker et al. |
| 6,429,113 | B1 | 8/2002 | Lewis et al. |
| 6,483,419 | B1 | 11/2002 | Weaver et al. |
| 6,488,315 | B1 | 12/2002 | Brenner et al. |
| 6,531,947 | B1 | 3/2003 | Weaver et al. |
| 6,561,725 | B1 | 5/2003 | Ellis et al. |
| 6,617,522 | B1 | 9/2003 | Tabacutu |
| 6,672,795 | B1 | 1/2004 | Ellis et al. |
| 6,678,458 | B1 | 1/2004 | Ellis |
| 6,679,055 | B1 | 1/2004 | Ellis |
| 6,691,513 | B1 | 2/2004 | Kolesar |
| 6,745,567 | B1 | 6/2004 | Mercanzini |
| 6,762,116 | B1 | 7/2004 | Skidmore |
| 6,764,325 | B1 | 7/2004 | Arrigotti et al. |
| 6,837,723 | B1 | 1/2005 | Randall et al. |
| 6,862,921 | B1 | 3/2005 | Chand et al. |
| 6,881,074 | B1 | 4/2005 | McLenaghan |
| 6,923,669 | B1 | 8/2005 | Tsui et al. |
| 2001/0010348 | A1 | 8/2001 | Bilanin et al. |
| 2002/0125208 | A1 | 9/2002 | Christenson et al. |
| 2003/0201654 | A1 | 10/2003 | Ellis |
| 2003/0210115 | A1 | 11/2003 | Kubby et al. |
| 2004/0135526 | A1 | 7/2004 | Winkler et al. |

FOREIGN PATENT DOCUMENTS

| | | |
|---|---|---|
| EP | 0490530 | 6/1992 |
| EP | 0497620 | 8/1992 |
| JP | 57161819 | 10/1982 |
| JP | 05166973 | 7/1993 |
| JP | 06061691 | 3/1994 |
| WO | WO 9713981 | 4/1997 |

OTHER PUBLICATIONS

Tsui et al., "Micromachined end-effector and techniques for directed MEMS assembly," Journal of Micromechanics and Microengineering, Institute of Physics Publishing, United Kingdom 2004, pp. 1-8.

Ellis, et al., "High aspect ratio silicon micromechanical connectors", High Aspect Ratio Micro-Structure Technology Workshop, Jun. 15-17, 2003, Monterey, California USA.

M. Szilagyi et al., "Synthesis of Electrostatic Focusing and Deflection Systems", JVST B 15(6), Nov./Dec. 1997, pp 1971.

Arai et al., "A New Pick Up & Release Method By Micromanipulation," IEEE, Jan. 1997.

Capanu et al., "Design, Fabrication, and Testing of a Bistable Electromagnetically Actuated Microvalve", Journal of Microelectromechanical Systems, vol. 9, No. 2, Jun. 2000, pp. 181-188.

Cohn et al., "Microassembly Technologies for MEMS", University of California at Berkley and University of Washington.

Cohn et al., "Self-Assembling Electrical Networks: An Application of Micromachining Technology", May 1991.

Comtois et al. "Applications for surface-micromachined polysilicon thermal actuators and arrays," Sensors and Actuators A58, 1997, pp. 19-25.

Comtois et al. "Electrothermal actuators fabricated in four-level planarized surface micromachined polycrystalline silicon," Sensors and Actuators A70, 1998, pp. 23-31.

Comtois et al., "Thermal Microactuators for surface-micromachining processes," SPIE vol. 2642, 1995, pp. 10-21.

Fearing, "Survey of Sticking Effects for Micro Parts Handling", IEEE, Apr. 1995.

Gomm et al., "In-Plane Linear Displacement Bistable Microrelay", 2002 IOP Publishing Ltd., UK, pp. 257-264.

Gracias et al., "Forming Electrical Networks in Three Dimensions by Self-Assembly", Science, vol. 289, Aug. 18, 2000, pp. 1170-1172.

Handbook of Industrial Robotics, Shimon Y. Nof, Editor, Chapter 26 and Section 4.1.4., pp. 478-479.

Handbook of Industrial Robotics, Shimon Y. Nof, Editor, Second Edition, 1999, Chapter 5, pp. 43-78.

Harsh et al., "Flip-Chip Assembly for Si-Based RF MEMS", NSF Center for Advanced Manufacturing and Packaging of Microwave, Optical and Digital Electronics, Department of Mechanical Engineering, University of Colorado.

Harsh et al., "Solder Self-Assembly for MEMS", NSF Center for Advanced Manufacturing and Packaging of Microwave, Optical and Digital Electronics, Department of Mechanical Engineering, University of Colorado.

Hitakawa, "Advanced Parts Orientation System Has Wide Application", Aug. 1988.

IBM Technical Disclosure Bulletin, "Chip-to-Chip Cable Connection," IBM Corp., vol. 27, No. 11, Apr. 1985, pp. 6761-6763.

International Preliminary Examination Report in PCT/US01/015011 dated Sep. 13, 2002.

International Preliminary Examination Report in PCT/US01/15059 dated Aug. 2, 2002.

International Preliminary Examination Report in PCT/US01/24173 dated Jan. 17, 2003.

International Search Report in PCT/US01/015011 dated Dec. 3, 2001.

International Search Report in PCT/US01/15059 dated Dec. 12, 2001.

Jensen et al., "Design Optimization of a Fully-Compliant Bistable Micro-Mechanism", Proceedings of 2001 ASME International Mech. Eng. Congress and Expo., New York, Nov. 2001, pp. 1-7.

Keller et al., "Hexsil Tweezers for Teleoperated Microassembly", IEEE Micro Electro Mechanical Systems Workshop, 1997, pp. 72-77.

Keller, Microfabricated High Aspect Ratio Silicon Flexures, 1998.

Kruglick et al., "Bistable MEMS Relays and Contact Characterization", University of California Berkeley Sensors and Actuators Center, pp. 1-5.

Maekoba et al., "Self-Aligned Vertical Mirror and V-Grooves Applied to an Optical-Switch: Modeling and Optimization of Bistable Operation by Electromagnetic Actuation", Sensors and Actuators A 87, 2001, pp. 172. 178.

Mohr, "LIGA-A Technology for Fabricating Microstructures and Microsystems," Sensors and Materials, vol. 10, No. 6, 1998, pp. 363-373.

Muray et al., "Advances in Arrayed Microcolumn Lithography", Journal of Vacuum Science and Technology. B, Microelectronics and Nanometer Structures Processing, Measurement and Phenomena: An Official Publication of the American Vacuum Society, vol. 18 (6), Nov./Dec. 2000, pp. 3099-3104.

Prasad et al., "Design, Fabrication, and Characterization of Single Crystal Silicon Latching Snap Fasteners for Micro Assembly", Proc. ASME Int.Mech.Eng. Congress and Expo. (IMECE'95), San Francisco, CA, Nov. 1995.

Qiu et al., "A Centrally-Clamped Parallel-Beam Bistable MEMS Mechanism", IEEE 2001, pp. 353-356.

Schreiber et al., "Surface Micromachined Electrothermal V-Beam Micromotors", Proc of 2001 ASME International Mechanical Engineering Congress and Exp., Nov. 11, 2001.

Search Report in PCT/US01/24173 dated May 17, 2002.

Taher et al., "On a Tunable Bistable MEMS- Theory and Experiment", Journal of Microelectromechanical Systems, vol. 9, No. 2, Jun. 2000, pp. 157-170.

Yeh et al., "Fluidic Self-Assembly of Microstructures and its Application to the Integration of GaAs on Si", IEEE, Jan. 1994, pp. 279-284.

Yeh et al., "Single Mark , Large Force, and Large Displacement Electrostatic Linear Inchwork Motors," Berkley Sensor and Actuator Center, Department of Electrical Engineering and Computer Science, University of California, Berkley.

Yeh et al., "Surface-Micromachined Components for Articulated Microrobots" Journal of Microelectromechanical Systems, vol. 5, No. 1, Mar. 1996.

* cited by examiner

US 7,025,619 B2

SOCKETS FOR MICROASSEMBLY

CROSS-REFERENCE TO RELATED APPLICATIONS

This application is a Continuation-In-Part of, and claims the benefit of, commonly-assigned U.S. patent application Ser. No. 10/778,460, entitled "MEMS MICROCONNECTORS AND NON-POWERED MICROASSEMBLY THEREWITH," filed on Feb. 13, 2004 now U.S. Pat. No. 6,923,669, the entirety of which is hereby incorporated by reference herein.

This invention was made with the United States Government support under 70NANB1H3021 awarded by the National Institute of Standards and Technology (NIST). The United States Government has certain rights in the invention.

BACKGROUND

Extraordinary advances are being made in micromechanical devices and microelectronic devices, including micro-electro-mechanical devices (MEMs), which comprise integrated micromechanical and microelectronic devices. The terms "microcomponent," "microconnector," "microdevice," and "microassembly" are used herein generically to encompass microelectronic components, micromechanical components, MEMs components and assemblies thereof.

Many methods and structures exist for coupling MEMs and other microcomponents together to form a microassembly. One such method, often referred to as "pick-and-place" assembly, is serial microassembly, wherein microcomponents are assembled one at a time in a serial fashion. For example, if a device is formed by coupling two microcomponents together, a gripper or other placing mechanism is used to pick up one of the two microcomponents and place it on a desired location of the other microcomponent. These pick-and-place processes, although seemingly quite simple, can present obstacles affecting assembly time, throughput and reliability.

For example, pick-and-place processes often employ powered "grippers" having end effectors configured to expand and/or contract in response to energy received from an integral or external power source. However, structural fragility, increased packaging complexity, and uncertainties due to variations in actuator displacements limit the practical usefulness of employing such powered grippers during microassembly.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
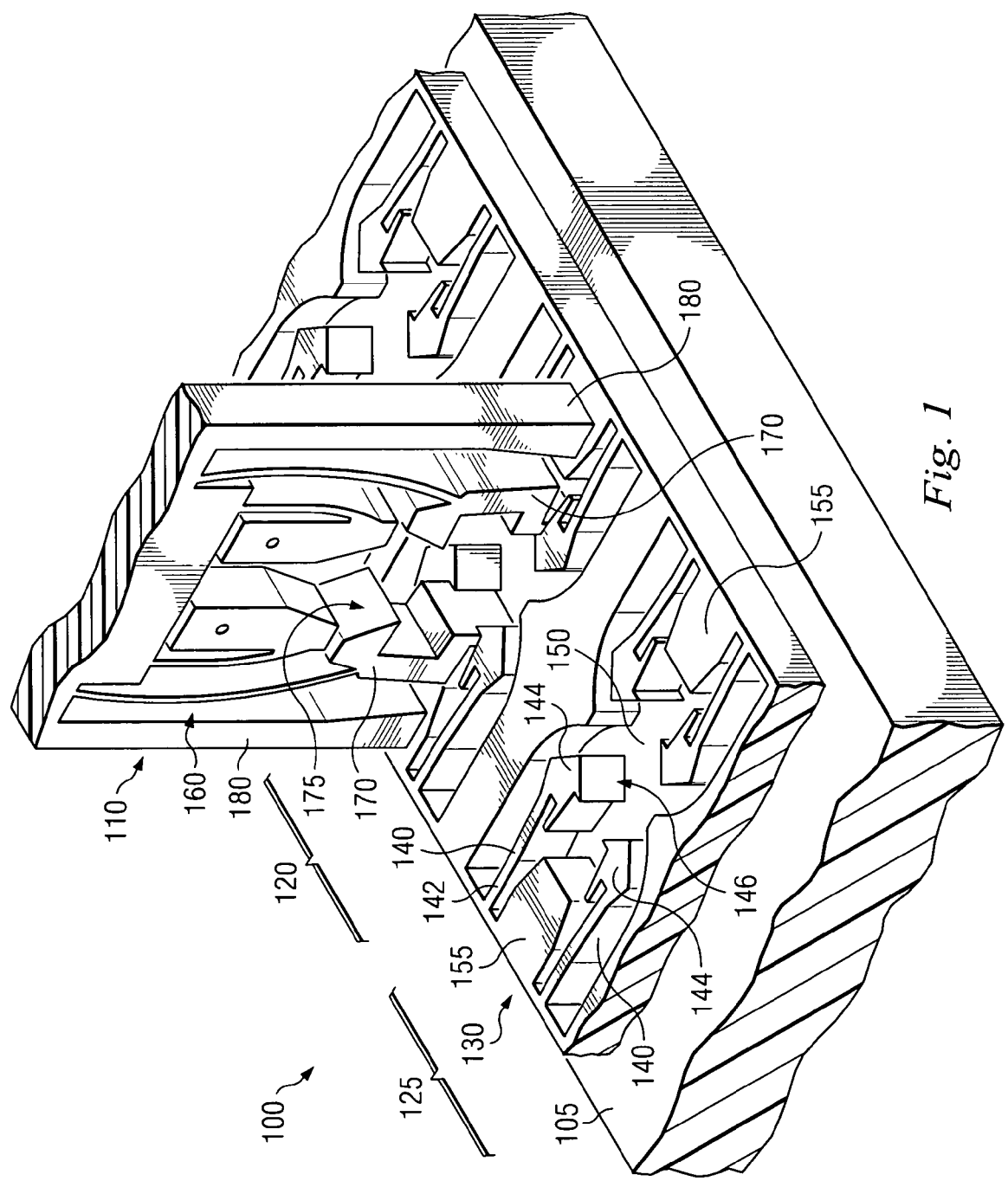
FIG. 1 illustrates a perspective view of a portion of one embodiment of a microassembly according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a perspective view of a portion of one embodiment of a microassembly 100 constructed according to aspects of the present disclosure. The microassembly 100 includes a microconnector 110 assembled to a receptacle 120. A portion of an unoccupied receptacle 125 is also shown. In the illustrated embodiment, the microconnector 110 has been assembled to the receptacle 120 without the use of a powered gripper or other actuator.

The microconnector 110 and the receptacle 120 may be micro-electro-mechanical system (MEMS) components having feature dimensions that are less than about 1000 microns. The microconnector 110 and the receptacle 120 may also be nano-electro-mechanical system (NEMS) components having feature dimensions that are less than about 10 microns. This convention may be generally applied to any microcomponent of the microassemblies described herein. For example, the microassembly 100 and others described below may include MEMS components having feature dimensions that are less than about 1000 microns and/or NEMS components having feature dimensions that are less than about 10 microns.

The receptacles 120, 125 are defined in or otherwise coupled to a substrate 105, and each include a retainer 130 which, at least in the embodiment shown, includes two legs 140. The legs 140 are coupled to or otherwise affixed to the substrate 105 at one end 142 and are free to translate across the substrate 105 at another end 144. The ends 144 have tapered surfaces 146, such that insertion of a portion of the microconnector 110 therebetween causes the legs 140 to deflect away from each other. The receptacles 120, 125 also include an aperture 150 configured to receive a portion of the microconnector 110, as well as one or more anchor pads 155.

The microconnector 110 includes a deflectable connection member 160 which, at least in the embodiment shown, includes two legs 170. The legs 170 have a pre-engaged position in which they are configured to fit within the aperture 150. Once oriented within the aperture 150, the legs 170 may be configured to deflect away from each other to each engage and/or be engaged by a corresponding pair of receptacle legs 140 (as in the orientation shown in FIG. 1). In one embodiment, the legs 170 include tapered surfaces 175 to enable such deflection of the legs 170. The microconnector 110 also includes one or more anchor arms 180 configured to stop or rest against one or more corresponding anchor pads 155.

Figure 2A:
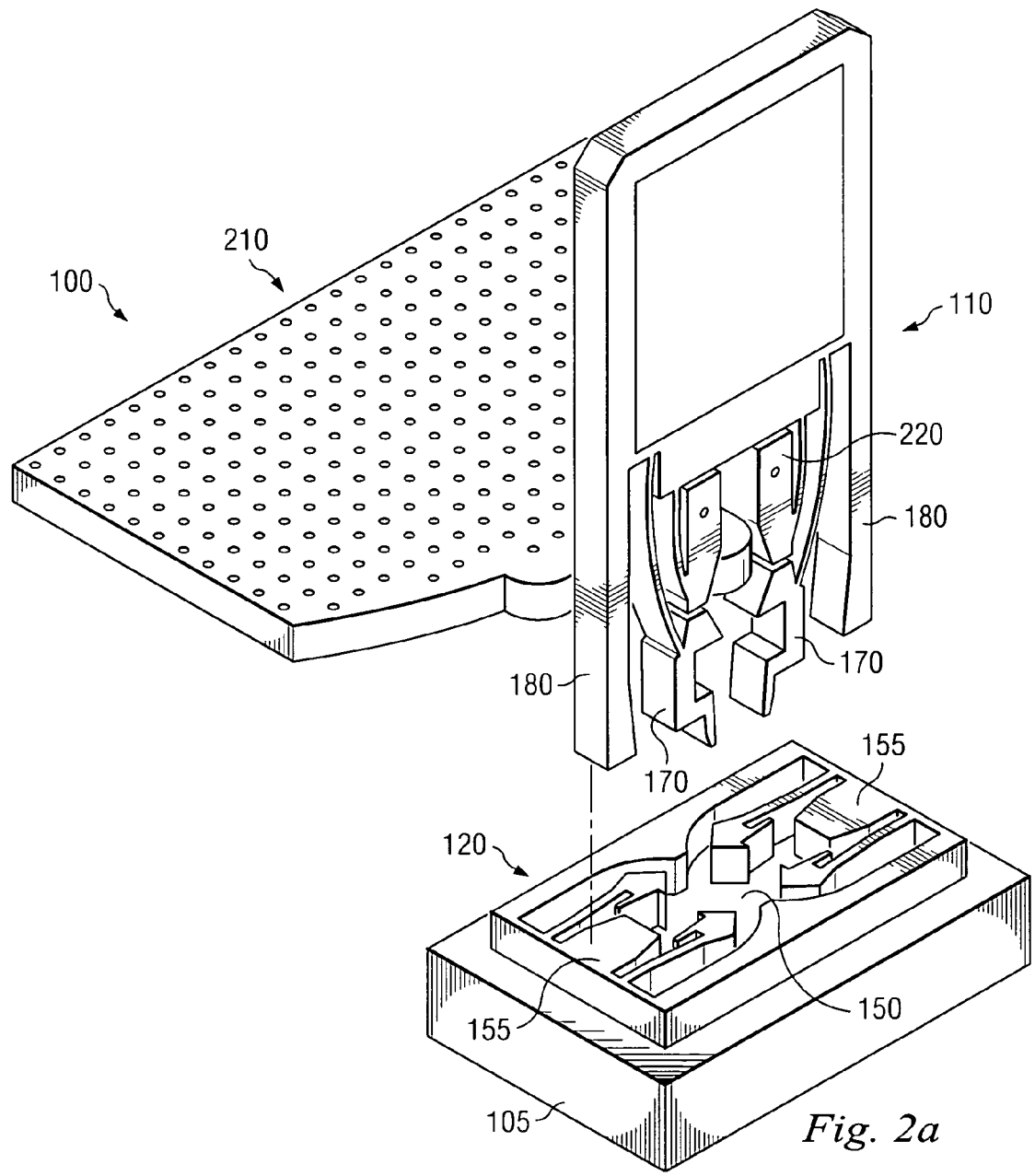
FIGS. 2a and 2b illustrate perspective views of intermediate stages of one embodiment of microassembly according to aspects of the present disclosure.
Figure 2B:
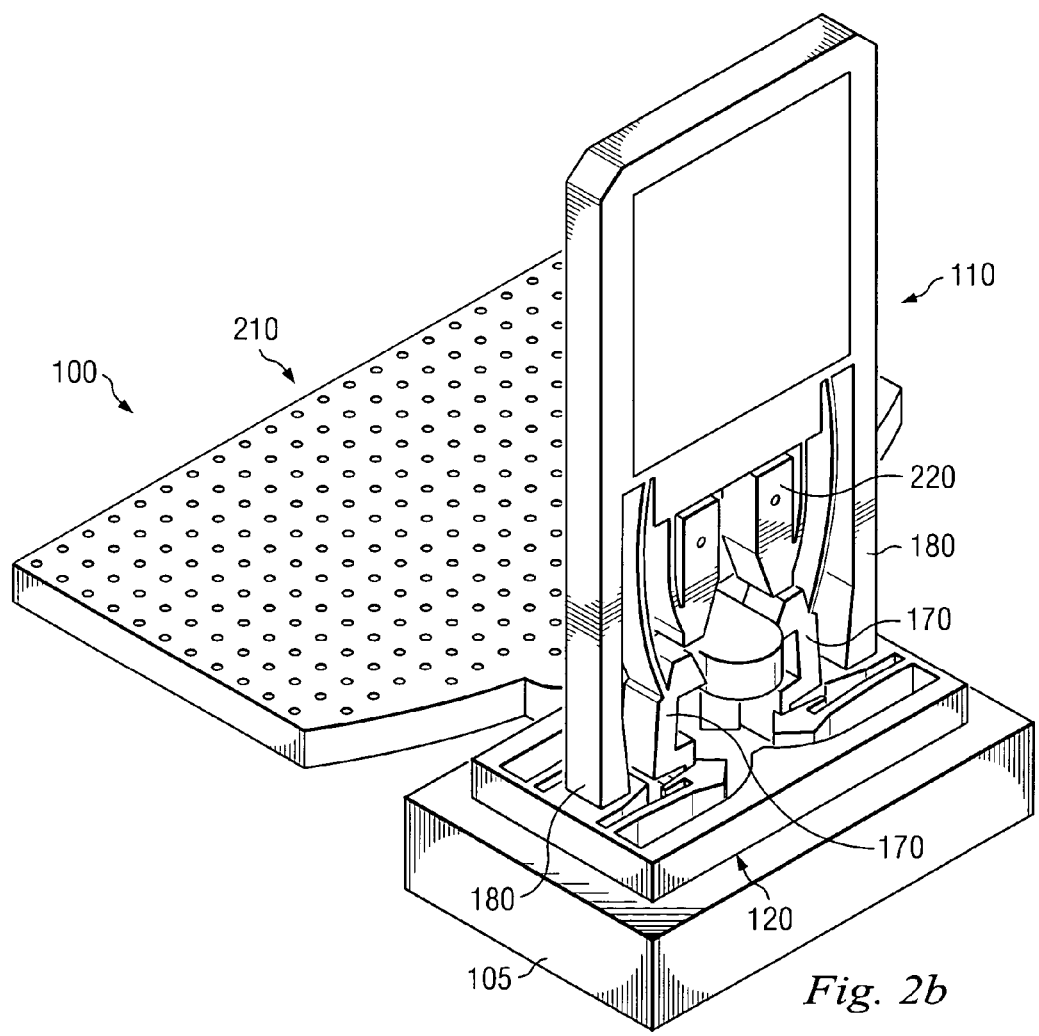

Referring to FIGS. 2a and 2b, with continued reference to FIG. 1, illustrated are perspective views of the microassembly 100 shown in FIG. 1 during intermediate stages of assembly. In FIG. 2a, the microconnector 110 has been retained by a manipulation probe 210. The microconnector 110 may include a compliant handle 220 configured to deflect as the manipulation probe 210 is inserted, and the manipulation probe 210 may have a profile that allows it to be inserted into the compliant handle 220 by translation in one or more directions. The compliant handle 220 may include two or more members configured to deflect away from each other or towards each other, depending on the shape of the manipulation probe 210.

After engaging the microconnector 110 with the manipulation probe 210, the microconnector 110 may be oriented as necessary for pre-assembly alignment with the receptacle 120. Such orientation may include translation and/or rotation relative to the substrate 105. For example, in the illustrated embodiment, the manipulation probe 210 may have been employed to remove the microconnector 110 from a configuration substantially parallel to that of the receptacle 120 and, thereafter, rotate the microconnector 110 about 90 degrees relative to the substrate 105 and align the microconnector 110 over the receptacle 120. In other embodiments, substantial parallelism of the microconnector 110 and the receptacle 120 may be maintained while the manipulation probe 210 orients the microconnector 110 relative to the receptacle 120.

As shown in FIG. 2b, the manipulation probe 210 may be manipulated to bring the microconnector 110 and the receptacle 120 into contact with each other. As discussed above, the microconnector 110 may include legs 170 configured to be received within an aperture 150 in the receptacle 120 as the microconnector anchor arms 180 are brought into contact with receptacle anchor pads 155. Thereafter, the manipulation probe 210 may be further translated towards the receptacle 120, whereby such further translation may cause the microconnector legs 170 and the receptacle legs 140 to each deflect outwards until they are allowed to engage each other. The manipulation probe 210 may then be translated out of the handle 220 and then substantially parallel to the substrate 105 to remove the probe 210 from the microconnector 110, wherein the microconnector 110 may remain assembled to the receptacle 120.

Figure 3:
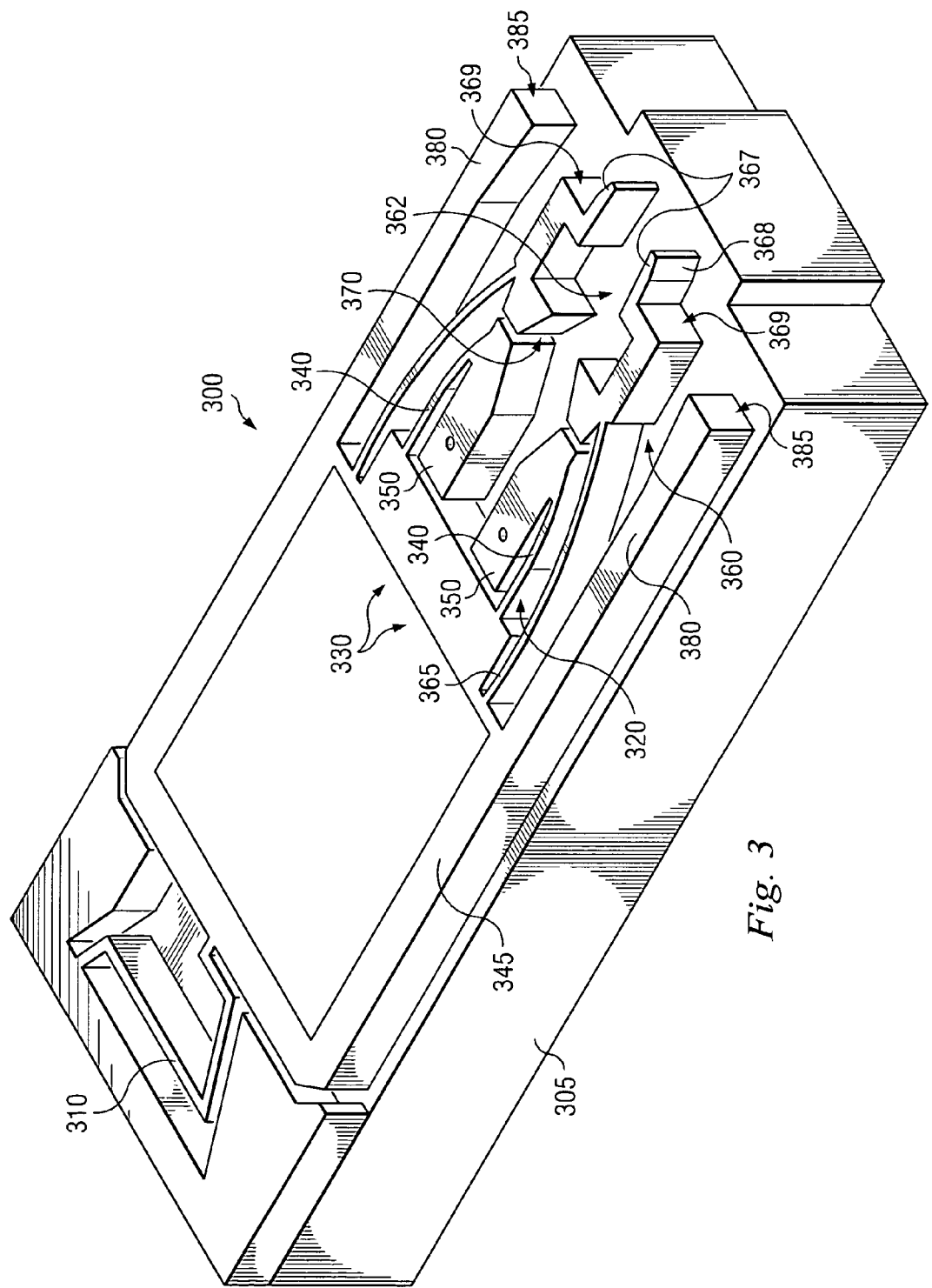
FIG. 3 illustrates a perspective view of one embodiment of a microconnector according to aspects of the present disclosure.

Referring to FIG. 3, illustrated is a perspective view of one embodiment of a microconnector 300 constructed according to aspects of the present disclosure. In one embodiment, the microconnector 300 is substantially similar to the microconnector 110 shown in FIGS. 1, 2a and 2b.

The microconnector 300 may be defined in a single-crystalline silicon (SCS) layer, possibly having a thickness ranging between about 25 μm and about 200 μm. The SCS layer may be located over a sacrificial layer formed over a substrate 305, wherein the sacrificial layer may comprise oxide and/or other materials and may have a thickness ranging between about 1 μm and about 30 μm. One or more deep reactive ion etching (DRIE) processes and/or other processes may be employed to define the microconnector 300 from the SCS layer. Such a manufacturing process flow may include a backside DRIE through the substrate 305 or a handle portion thereof. In-plane electrical isolation may be achieved by trenches formed in the SCS layer and filled with nitride and/or another electrically insulating material.

The microconnector 300 is released from the substrate 305 after fabrication and prior to assembly. Such a release process may employ a wet-etch of the sacrificial layer, possibly employing a 49% HF solution or other etchant chemistry. The microconnector 300 may also include a tether 310 defined in the SCS layer, such that the microconnector 300 does not become completely detached from the substrate 305 during the release process.

The microconnector 300 includes a handle 320 configured to frictionally engage a manipulation probe, such as the probe 210 shown in FIG. 2. In one embodiment, the handle 320 is defined in the SCS layer as having two or more compliant legs 330 configured to deflect away from each other in response to insertion of the manipulation probe. Thus, the handle 320 may be a compliant handle. The legs 330 may be formed separated from each other by a distance about equal to or at least slightly less than the width of the manipulation probe tip or other portion configured to be grasped by the legs 330. In one embodiment, such separation between the legs 330 may range between about 25 μm and about 300 μm. Although not limited by the scope of the present disclosure, the legs 330 may have a length ranging between about 50 μm and about 500 μm.

As in the illustrated embodiment, the legs 330 (or perhaps one or more other portions of the handle 320) may each include narrower members 340 connected at one end to a microconnector body 345 and at a second end to wider members 350 configured to grasp the manipulation probe. The narrower members 340 may each have a width ranging between about 5 μm and about 30 μm, and the wider members 350 may each have a width ranging between about 10 μm and about 100 μm.

The microconnector 300 also includes a deflectable connection member 360 having at least one first end 365 coupled to the handle, possibly via the body 345, as in the illustrated embodiment. The connection member 360 also includes at least one second end 367 configured to deflect and thereby engage a receptacle in response to disengagement of a manipulation probe from the handle 320. The one or more second ends 367 may include a barb, hook, lip, extension, tab, and/or other means 368 (hereafter collectively referred to as a barb) for engaging, mating or otherwise interfacing with an edge, surface or barb of the receptacle. The one or more second ends 367 may also include a shoulder or other interface means 369 (hereafter collectively referred to as a shoulder) for engaging, mating or otherwise interfacing with an edge, surface or barb of the receptacle, in addition to or as an alternative to the barb 368.

The connection member 360 may include tapered surfaces 370 or other means for deflecting outward in response to translation of the manipulation probe away from a retained position within the handle 320. The connection member 360 may also include an aperture 362 permitting removal of the manipulation probe after the microconnector 300 is secured to the receptacle. The width of the aperture 362 may be about equal to or at least slightly greater than a manipulation probe or tip thereof. The microconnector 300 may also include one or more anchor arms 380 coupled or integral to the body 345 and extending to a bearing plane, shoulder or other type of interface 385 configured to rest against a receptacle as a manipulation probe is translated from the handle 320 towards the aperture 362.

As described above, the microconnector 300 may also include a tether 310 configured to prevent inadvertent release of the microconnector 300 from the substrate 305. Prior to microassembly of the microconnector 300 to another MEMS or NEMS component, the tether 310 may be severed to release the microconnector 300 from the substrate 305. Such de-tethering of the microconnector 300 from the substrate 305 may be mechanical, such as by translating and/or rotating the microconnector 300 away from the substrate 305 until the tether 310 breaks, or by pressing against and/or slicing into the tether 310 with a probe or other object. The microconnector 300 may also be de-tethered electrically, such as by increasing a current flow through the tether 310 until the tether 310 severs, possibly by ohmic heating. The tether 310 may have a width ranging between about 5 µm and about 30 µm.

Although not shown in the illustrated embodiment, the microconnector 300 may also include means for detecting when the microconnector 300 is fully engaged with a receptacle. For example, the interface means 369 may include conductive contacts and/or other means which may close a circuit across anchor pads of the receptacle. In one embodiment, the connection member 360 may be similarly or alternatively configured to close a circuit across the receptacle, thereby indicating engagement of the microconnector 300 and the receptacle.

Figure 4:
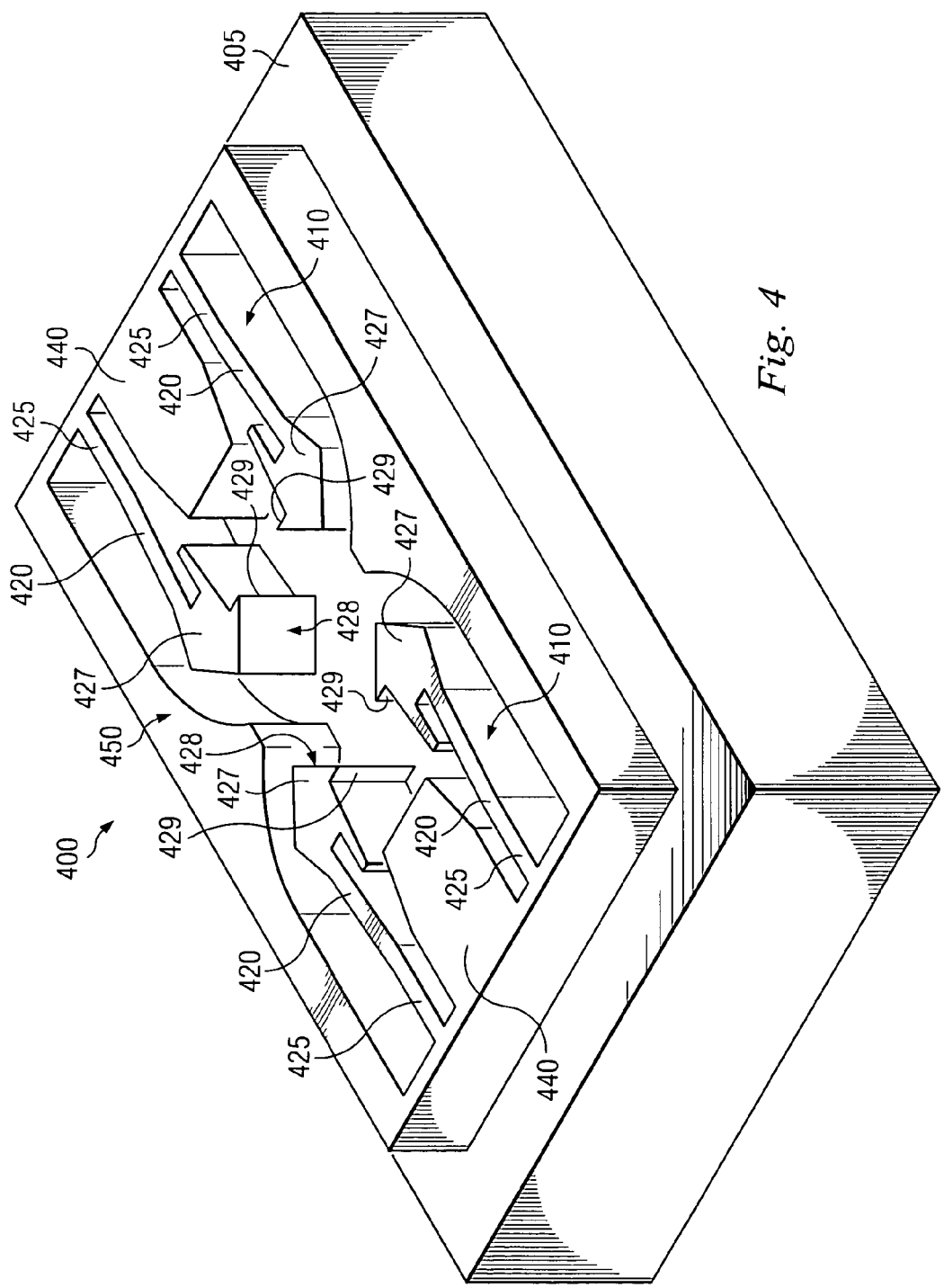
FIG. 4 illustrates a perspective view of one embodiment of a microconnector receptacle according to aspects of the present disclosure.

Referring to FIG. 4, illustrated is a perspective view of one embodiment of a receptacle 400 constructed according to aspects of the present disclosure. In one embodiment, the receptacle 400 is substantially similar to the receptacle 120 shown in FIGS. 1, 2a and 2b. The receptacle 400 may be substantially similar in composition and manufacture to the microconnector 300 shown in FIG. 3. In one embodiment, the receptacle 400 and the microconnector 300 are defined in a common SCS layer over a common substrate 405, possibly simultaneously.

The receptacle 400 includes one, two or more deflectable retainers 410. The retainers 410 each include one, two, or more legs 420. The legs 420 each include a first end 425 coupled to the substrate 405 and a second end 427 configured to translate across the substrate 405. The translation of the second ends 427 of the legs 420 across the substrate 405 may be in response to the travel of a portion of a microconnector (such as the second ends 367 of the microconnector 300 shown in FIG. 3) against tapered surfaces 428 of the second ends 427. Each of the second ends 427 may also include a barb, hook, lip, extension, tab, and/or other means 429 (hereafter collectively referred to as a barb) for engaging, mating or otherwise interfacing with an edge, surface or barb of a microconnector.

The receptacle 400 may also include one or more anchor pads 440 coupled or integral thereto. The anchor pads 440 may be configured to resist translation (e.g., provide a travel "stop") of a microconnector as a manipulation probe is translated within a microconnector towards the receptacle 400. For example, the anchor pads 440 may be configured to interface with the anchor arm interfaces 385 shown in FIG. 3.

The receptacle 400 may also include an aperture 450 configured to receive a portion of a microconnector during microassembly. For example, the aperture 450 may be sized to receive the ends 367 of the microconnector 300 shown in FIG. 3. Thus, a microconnector may be inserted into the aperture 450 of the receptacle 400 until the anchor pads 440 stop translation of the microconnector into the receptacle 400, such that further translation of a manipulation probe within the microconnector towards the receptacle 400 causes the retainers 410 to deflect and subsequently engage with the microconnector.

Figure 5:
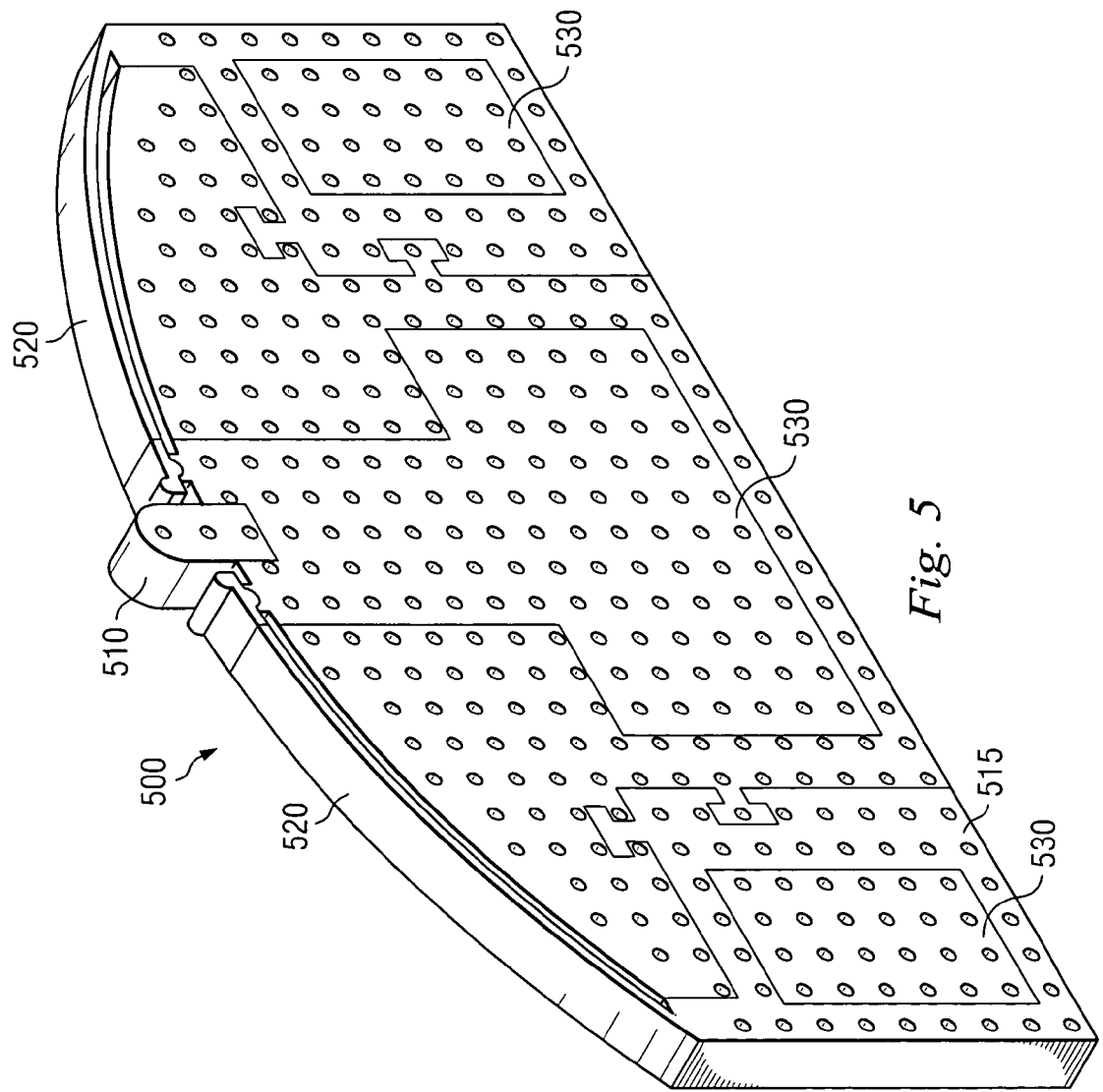
FIG. 5 illustrates a perspective view of one embodiment of a manipulation probe according to aspects of the present disclosure.

Referring to FIG. 5, illustrated is a perspective view of one embodiment of a manipulation probe 500 that may be employed during microassembly according to aspects of the present disclosure. In one embodiment, the manipulation probe 500 is substantially similar to the manipulation probe 210 shown in FIGS. 2a and 2b. The manipulation probe 500 may be substantially similar in composition and manufacture to the microconnector 300 shown in FIG. 3. In one embodiment, the manipulation probe 500 and the microconnector 300 (and possibly the retainer 400 shown in FIG. 4) are defined in a SCS layer over a common substrate, possibly simultaneously.

In the illustrated embodiment, the manipulation probe 500 includes a tip 510 extending from a body portion 515. The tip 510 is configured to be retained by a microconnector without requiring powered actuation of the tip 510 or the microconnector. For example, the tip 510 may be configured to be inserted into the handle 320 shown in FIG. 3, thereby deflecting portions of the handle 320, such that the handle 320 and the tip 510 may be frictionally engaged.

The manipulation probe 500 may also include deflectable sensor members 520. In the illustrated embodiment, the sensor members 520 are thin members offset a short distance (e.g., about 100 microns or less) from the perimeter of the body 515 and coupled to the body 515 distal from the tip 510. In this manner, the sensor members 520 may be deflected towards the body 515 upon insertion of the tip 510 into a microconnector. For example, a portion of a microconnector may bias the sensor members 520 towards the body 515. Consequently, the contact of the sensor members 520 with the body 515 may close an electrical circuit or otherwise provide an indication to a microassembly controller and/or operator that the tip 515 is inserted a distance into the microconnector sufficient for the manipulation probe 500 and the microconnector to be engaged. The manipulation probe 500 may also include probe pads, bond pads, or other contacts (hereafter collectively referred to as contacts) 530 for sensing contact of the sensor members 520 with the body 515.

Figure 6:
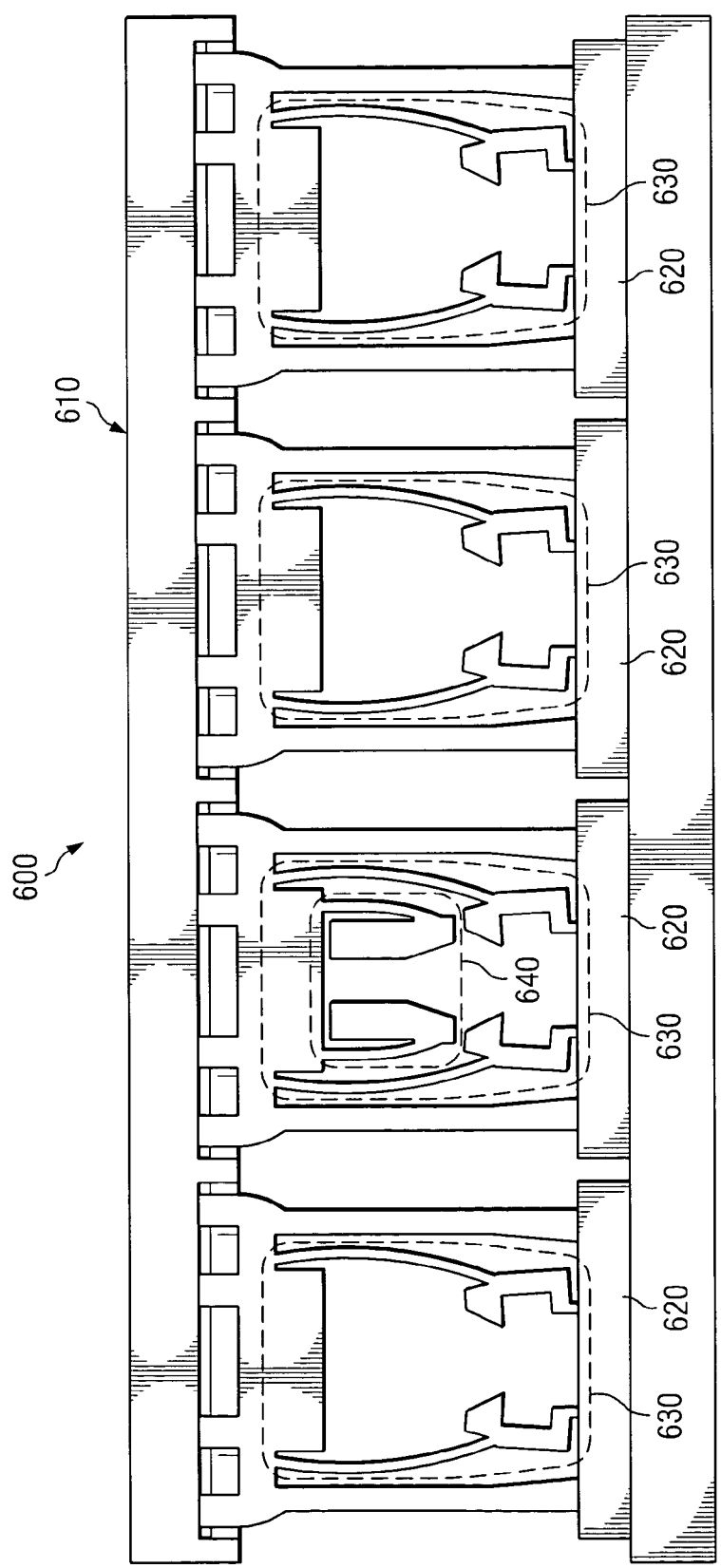
FIG. 6 illustrates a perspective view of another embodiment of a microassembly according to aspects of the present disclosure.

Referring to FIG. 6, illustrated is perspective view of another embodiment of a microassembly 600 according to aspects of the present disclosure. The microassembly includes a microconnector 610 and one or more receptacles 620. The microconnector 610 is substantially similar in composition and manufacture to the microconnector 300 shown in FIG. 3. However, the microconnector 610 includes a plurality of deflectable connection members 630 which may each be substantially similar to the deflective connection member 160 of FIG. 3. Each of the deflectable connection members 630 may be configured to engage or be engaged by a receptacle 620. The microconnector 610 also includes one or more handles 640 configured to engage or be engaged by a manipulation probe. However, as in the illustrated embodiment, the microconnector 610 may include only one handle 640 (or only two handles 640, such as where redundancy may be required). That is, each of the deflectable connection members 630 may be actuated by translation of a corresponding manipulation probe tip towards the receptacles 620, although not all of the manipulation probe tips may be engaged by a handle 640.

The receptacles 620 may each be substantially similar to the receptacle 400 shown in FIG. 4. However, in one embodiment, the receptacles 620 may be formed as a single, composite receptacle.

The manipulation probe employed during microassembly of the microconnector 610 the receptacles 620 may have a number of tips corresponding to the number of deflectable connection members 630. Otherwise, such a manipulation probe may be substantially similar to the manipulation probe 500 shown in FIG. 5. However, a manipulation probe having fewer tips than the number of deflectable connection members 630 may also be employed during microassembly. For example, a manipulation probe including only one tip may be employed during the microassembly of a microconnector 610 having a plurality of connection members 630. In one such embodiment, such as that illustrated in FIG. 6, the handle 640 is employed to manipulate and position the microconnector 610 with a single manipulation probe tip engaged by the handle 640, although the microconnector 610 includes 4 connection members 630. Once positioned, the single probe tip may be employed to engage one of the connection members 630 of the microconnector 610 with the receptacle(s) 620, such as by translating the probe tip away from the handle 640 and towards the receptacle(s) 620. Thereafter, the probe tip may be repositioned into one of the remaining connection members 630 and again translated toward the receptacle(s) 620 to engage a second connection member 630 with the receptacle(s) 620. This process may be repeated until each of the connection members 630 is engaged with the receptacle(s) 620.

Figure 7A:
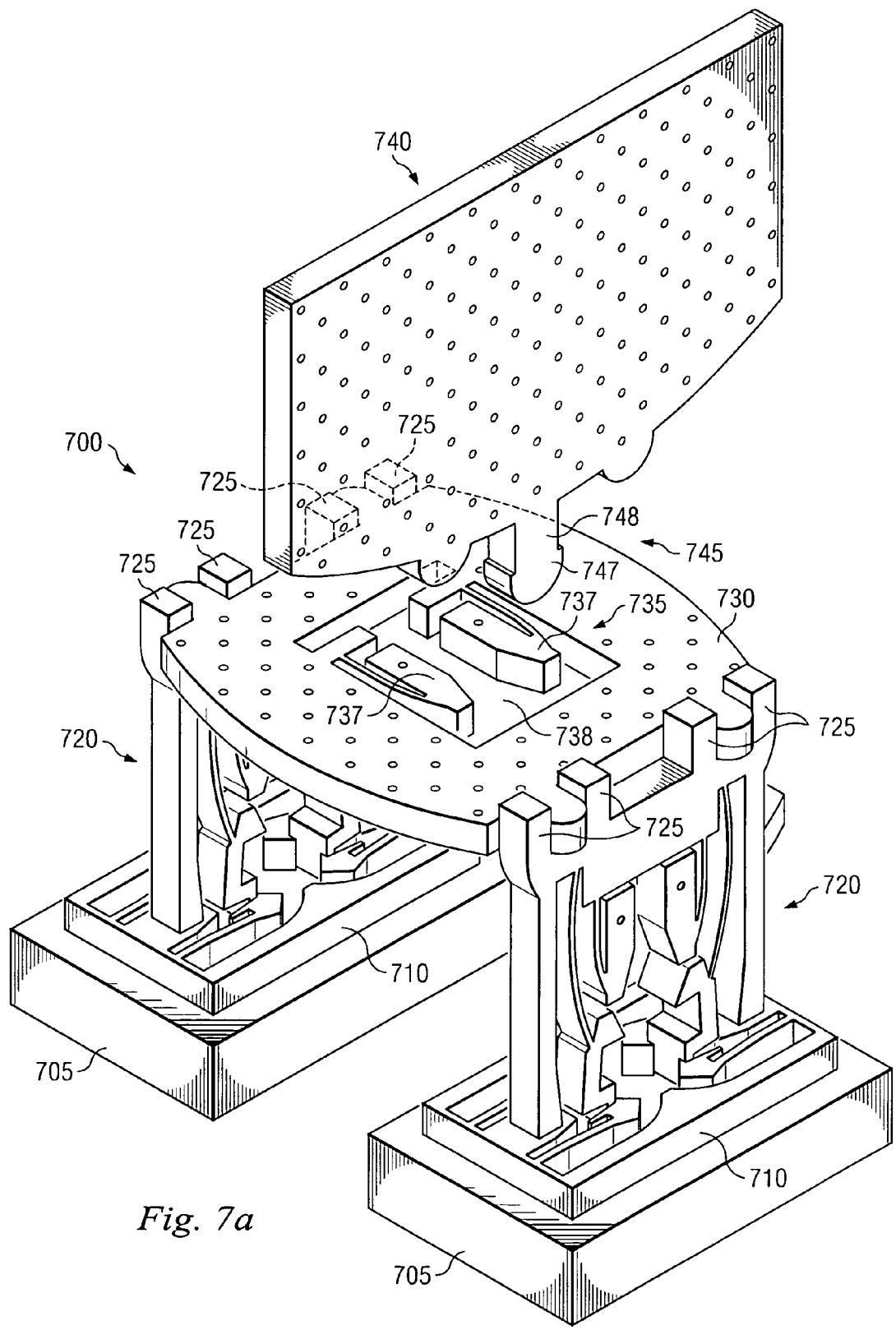
FIGS. 7a–c illustrate perspective views of another embodiment of a microassembly during intermediate stages of assembly according to aspects of the present disclosure.
Figure 7B:
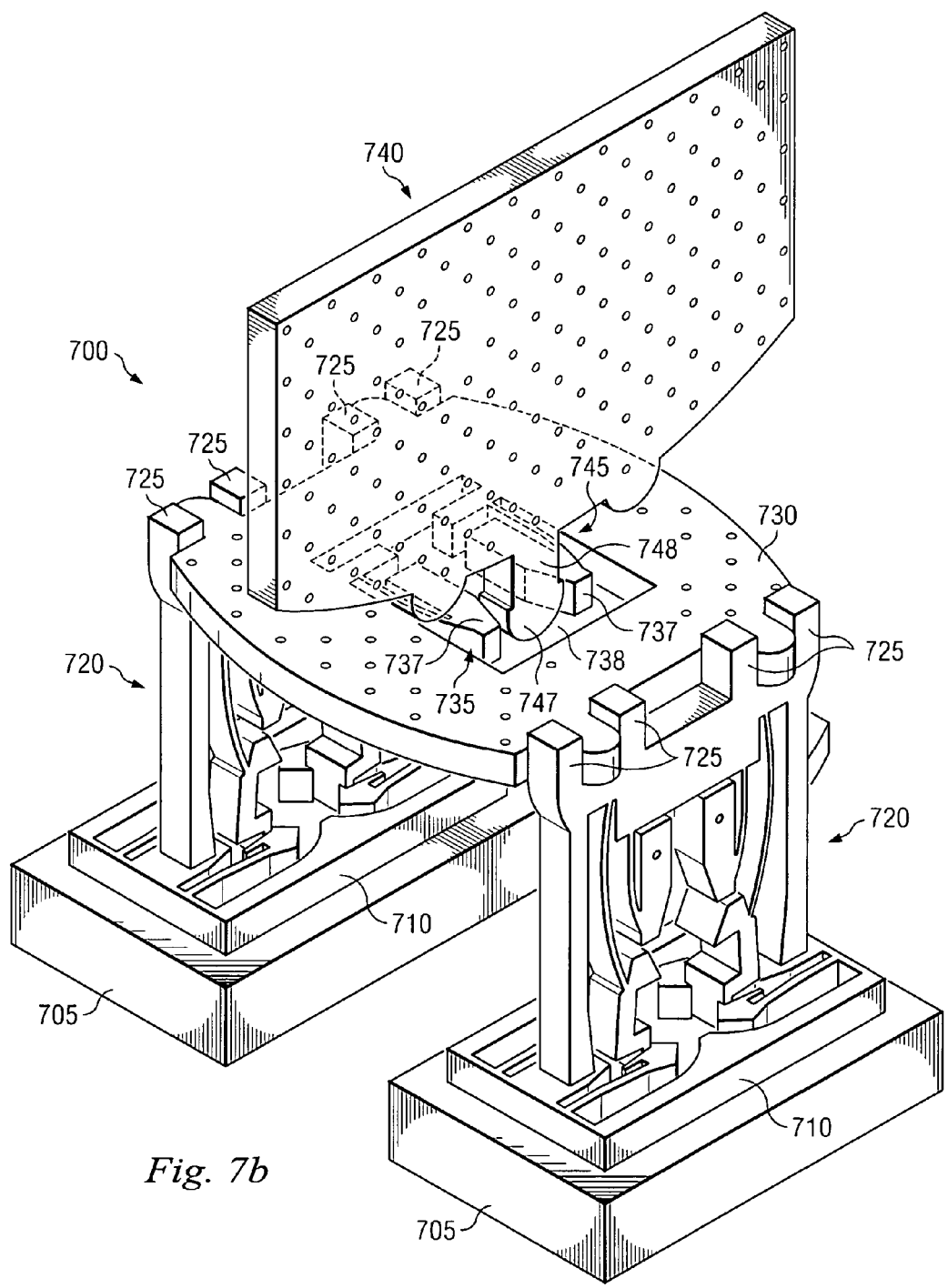
Figure 7C:
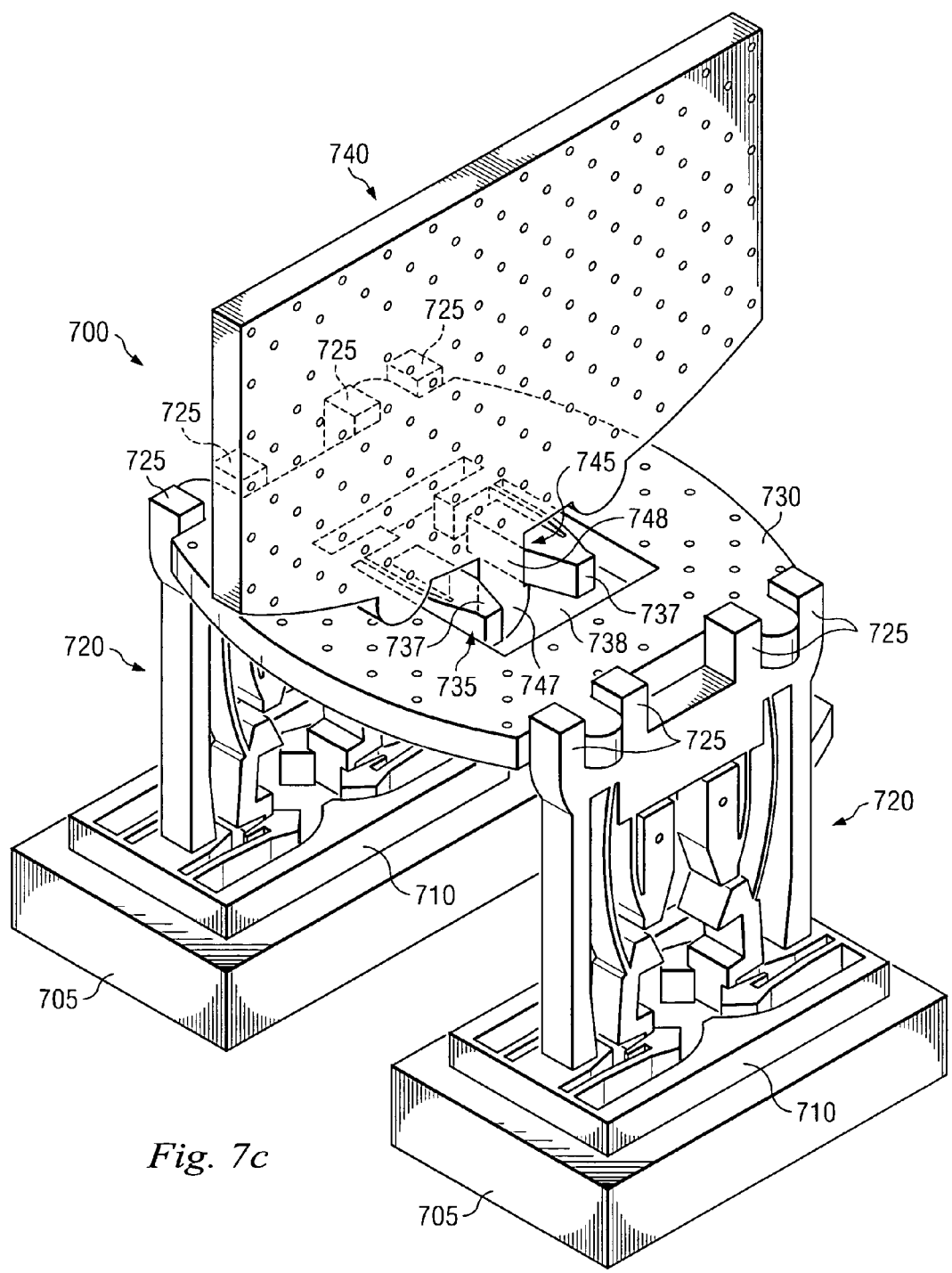

Referring to FIGS. 7a–c collectively, illustrated are perspective views of another embodiment of a microassembly 700 according to aspects of the present disclosure. The microassembly 700 includes two receptacles 710 oriented substantially parallel to a substrate 705, two microconnectors 720 assembled to the receptacles 710 in an orientation that is substantially orthogonal to the substrate 705, and a microconnector 730 assembled to the microconnectors 720 in an orientation that is substantially parallel to the substrate 705.

The receptacles 710 may each be substantially similar to the receptacle 400 shown in FIG. 4, and the microconnectors 720 may each be substantially similar to the microconnector 300 shown in FIG. 3. However, the microconnectors 720 may also include deflectable members 725 that may each be substantially similar to the deflectable members 360 shown in FIG. 3 and/or the retainers 410 shown in FIG. 4. For example, the members 725 may be configured to deflect outward to allow the receipt and engagement of a portion of the microconnector 730. The members 725 may be configured to engage protrusions 739 extending from the microconnector 730. In another embodiment, the microconnector 730 may include deflectable members configured to engage protrusions extending from the microconnectors 720. The microconnectors 720 may be assembled to the receptacles 710 by a microassembly method that is substantially similar to the methods described above in reference to FIGS. 1, 2a and 2b. A manipulation probe 740 which may be employed during such microassembly may include a probe tip 745 having a wider portion 747 and a narrower portion 748.

The microconnector 730 may be substantially similar in composition and manufacture to the microconnector 300 shown in FIG. 3. In the illustrated embodiment, the microconnector 730 includes a handle 735 configured to receive, engage, and/or be engaged by the tip 745 of the manipulation probe 740. The handle 735 may be substantially similar to the handle 320 shown in FIG. 3. For example, the handle 735 may include deflectable members 737 and an aperture 738 configured to receive and selectively retain the wider portion 747 of the manipulation probe tip 745. Thus, in one embodiment, the width of the wider portion 747 of the tip 745 may be about equal to or at least slightly greater than the width of the aperture 738, and the width of the narrower portion 748 of the tip 745 may be about equal to or at least slightly less than the width of the aperture 738.

During microassembly, the handle 735 and manipulation probe tip 745 are engaged such that the manipulation probe 740 may be translated, rotated, and otherwise manipulated to orient and align the microconnector 730 relative to the previously assembled microconnectors 720, as shown in FIG. 7a. The manipulation probe 740 may then be further translated towards the substrate 705, such that the microconnector 730 and the microconnectors 720 become fully engaged, and the manipulation probe tip 745 may travel further into the aperture 738 of the microconnector 730, as shown in FIG. 7b.

After the wider portion 747 of the manipulation probe tip 745 travels through the microconnector 730, as shown in FIG. 7b, the manipulation probe 740 may be translated substantially parallel to the substrate 705 and removed through a wider portion of the microconnector aperture 738, as shown in FIG. 7c.

Thus, the present disclosure introduces a MEMS microconnector including a compliant handle and a deflectable connection member. The compliant handle is configured to frictionally engage a manipulation probe. The deflectable connection member includes a first end coupled to the handle and a second end configured to deflect and thereby engage a receptacle in response to disengagement of the manipulation probe from the handle.

The present disclosure also provides a MEMS microconnector receptacle including a substrate, an aperture in the substrate configured to receive a microconnector in a pre-engaged orientation, and a deflectable retainer defined in the substrate. The deflectable retainer is configured to deflect away from a resting orientation in response to initial deflection of the microconnector, and is also configured to engage with the microconnector by returning towards the resting orientation in response to further deflection of the microconnector.

A MEMS microassembly is also provided in the present disclosure. In one embodiment, the microassembly includes a receptacle and a microconnector. The receptacle includes an aperture and a deflectable retainer. The microconnector includes a compliant handle configured to frictionally engage a manipulation probe, and also includes a deflectable connection member configured to deflect in response to translation of the manipulation probe away from the compliant handle, thereby causing the receptacle deflectable retainer to deflect, such that the deflectable retainer and the deflectable connection member may become engaged.

Another embodiment of a MEMS microassembly according to aspects of the present disclosure includes first and second substantially coplanar receptacles and first and second substantially parallel microconnectors coupled to the first and second receptacles, respectively. Such an embodiment also includes a third microconnector assembled to the first and second microconnectors and substantially parallel to the first and second receptacles. Assembly of the first and second microconnectors to the first and second receptacles, respectively, and of the third microconnector to the first and second microconnectors may also be achieved the engagement of deflectable connection members and deflectable retainers.

The present disclosure also introduces a method of assembling MEMS components. In one embodiment, the method includes frictionally engaging a microconnector with a manipulation probe, wherein the microconnector includes a deflectable connection member. The microconnector is oriented by manipulating the manipulation probe such that the connection member is proximate a receptacle, wherein the receptacle includes a deflectable retainer defining an aperture. A portion of the deflectable connection member is translated through the aperture by translating the manipulation probe until the microconnector contacts the receptacle. The manipulation probe is translated within the microconnector towards the receptacle to deflect the deflectable connection member and the deflectable retainer until the deflection of the deflectable retainer is allowed to decrease, the microconnector and the receptacle thereby becoming engaged.

A method of manufacturing a MEMS microassembly is also introduced in the present disclosure. In one embodiment, the method includes defining a microconnector and a receptacle from a layer formed over a substrate, engaging frictionally the microconnector and a manipulation probe, and orienting the microconnector opposite the receptacle from the substrate by manipulating the manipulation probe. The microconnector is translated towards the receptacle by manipulating the manipulation probe until the microconnector contacts the receptacle. The manipulation probe is translated within the microconnector towards the receptacle, the microconnector and the receptacle thereby becoming engaged.

Figure 8A:
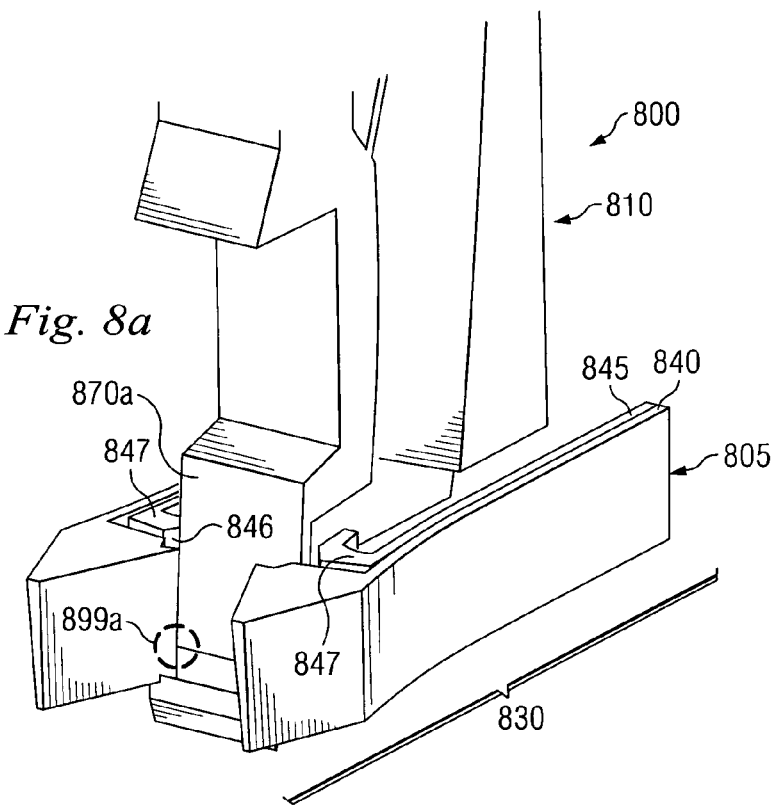
FIGS. 8a and 8b illustrate perspective views of another embodiment of a portion of a microassembly according to aspects of the present disclosure.
Figure 8B:
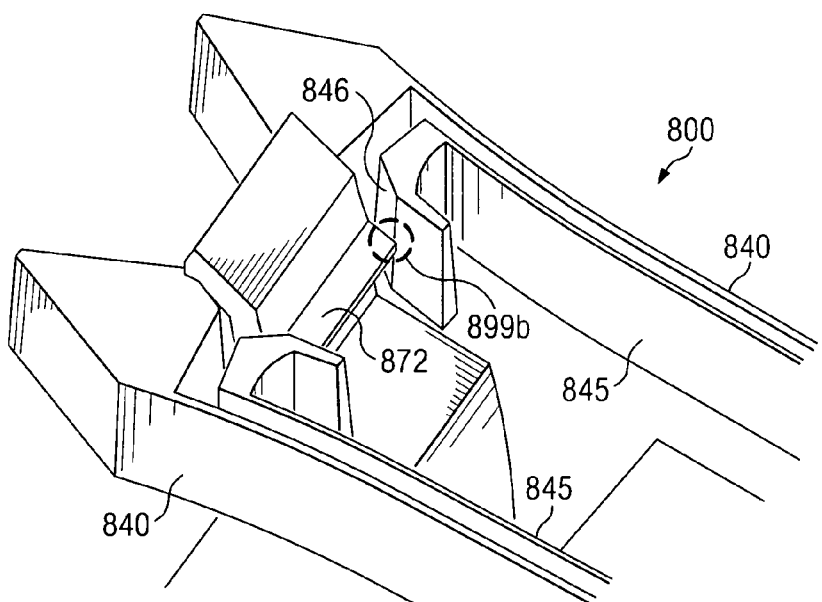

Referring to FIGS. 8a and 8b, illustrated are perspective views of at least a portion of another embodiment of a microassembly 800 according to aspects of the present disclosure. The microassembly 800, or at least the illustrated portion thereof, includes a receptacle 805 and a microconnector 810. The microconnector 810 may be substantially similar in construction, materials, geometry and/or operation relative to other microconnectors described herein, such as the microconnector 110 shown in FIG. 1. For example, among other similar characteristics between the microconnector 810 and the microconnector 110, the microconnector 810 may have a thickness that is no greater than about 1000 microns. In one embodiment, the microconnector 810 has a thickness of about 1000 microns.

The receptacle 805 may also be substantially similar in construction, materials, geometry and/or operation relative to other receptacles described herein, such as the receptacle 120 shown in FIG. 1, the receptacle 400 shown in FIG. 4, the receptacles 620 shown in FIG. 6, and/or the receptacles 710 and/or handle 735 shown in FIGS. 7a–c. For example, in the embodiment shown in FIGS. 8a and 8b, the receptacle 805 includes a retainer 830 having two legs 840, where the retainer 830 and the legs 840 are substantially similar to the retainer 130 and the legs 140 shown in FIG. 1. Additionally, as with the previously described receptacles, the receptacle 805 (or portions thereof) may have a thickness that is no greater than about 1000 microns, such as one embodiment in which the thickness is about 1000 microns.

However, the retainer 830 (and/or another portion of the receptacle 805) also includes two fingers 845. Like the legs 840, the fingers 845 may be or include substantially elongated members, possibly being substantially greater in thickness than in width and possibly greater in length that in width or thickness, such that the fingers 845 have sufficient flexibility to permit deflection when contacted with a portion of the microconnector 810. As shown in FIGS. 8a and 8b, the fingers 845 may collectively interpose the legs 840. Moreover, the fingers 845 may each have an outer profile (or footprint relative to an underlying substrate) that substantially conforms or corresponds to, or is otherwise substantially similar to, an inner profile of a proximate one of the legs 840. For example, the outer profile of one or more of the fingers 845 may be offset radially inward by a substantially constant distance from the inner profile of a proximate one of the legs 840. Moreover, as with the legs 840, the fingers 845 may be mirror-images of one another.

The fingers 845 are coupled to or otherwise affixed to a substrate at ends proximate the location where the legs 840 are coupled to the substrate, such that, like the legs 840, other ends 847 of the fingers 845 are free to translate across the substrate. The ends 847 may have tapered surfaces 846, such that insertion of a portion of the microconnector 810 therebetween causes the fingers 845 to deflect away from each other yet remain in contact with the inserted portion of the microconnector 810.

In other embodiments similar to the embodiment shown in FIGS. 8a and 8b, a different number of legs 840 and/or fingers 845 may be employed. For example, in one embodiment, only one finger 845 may be employed in addition to the two legs 840, while another embodiment may employ three or more fingers 845. In any case, the fingers 845 may be formed integral to the receptacle 805, such as by processes described above, possibly simultaneously with the formation of the legs 840. In other embodiments, the fingers 845 may be discrete components adhered or otherwise coupled to the receptacle 805.

The fingers 845 may, in some embodiments, improve the robustness and/or alignment of the microassembly 800. For example, in embodiments in which the fingers 845 are not employed, the contact between the microconnector 810 and the receptacle 805 may be limited to point and/or line contact at only two locations. However, in some embodiments employing one or more of the fingers 845, the contact between the microconnector 810 and the receptacle 805 may include point and/or line contact at three or more locations, which may improve the robustness and/or alignment of the coupling between the microconnector 810 and the receptacle 805.

The embodiment shown in FIGS. 8a and 8b also demonstrates that the microconnector 810 may include features which, at least in some embodiments, may improve the robustness and/or alignment of the microassembly 800. For example, in the illustrated embodiment, the microconnector 810 includes a substantially rectangular boss, shoulder, or other protrusion 872 extending from a portion of a leg 870 of the microconnector 810. The leg 870 may otherwise be substantially similar to the leg 180 shown in FIG. 1, among other embodiments described above.

The protrusion 872 may be configured to provide a larger area to be contacted by one or more of the fingers 845. In one embodiment, the protrusion 872 may be configured to increase the distance between points of contact between the microconnector 810 and the legs 840 and/or fingers 845. The protrusion 872 may also be configured to establish points of contact between the microconnector 810 and the receptacle 805 that are separated both horizontally and vertically, relative to a planar surface of the receptacle 805.

For example, in addition to the legs 840, the receptacle 805 may include one or more of the fingers 845 to establish three or more points of contact between the microconnector 810 and the receptacle 805, wherein one of the points of contact is located further from the planar surface 805a of the receptacle 805 than the other two or more points of contact, and wherein at least one of the points of contact is located on each of at least two different surfaces or edges of the leg 870 (e.g., a first contact location 899a is with one surface 870a of the leg 870, while a second contact location 899b is not with the surface 870a).

As described above with regard to FIGS. 1, 2a, 2b, 3 and 4, assembling the microconnector 810 to the receptacle 805 can include the deflection of ends of the microconnector 810 (or ends of legs or leg portions of the microconnector 810, such as the legs 170 shown in FIGS. 1, 2a and 2b). Such deflection may be in and/or establish a first plane of motion, which may be substantially perpendicular to a second plane in which the legs 840 and/or the fingers 845 deflect. For example, if the receptacle 805 is formed on or from a substrate, the legs of the microconnector 810 may deflect in a first plane that is substantially perpendicular to the substrate, whereas the legs 840 and/or the fingers 845 of the receptacle 805 may deflect in a second plane that is substantially parallel to the substrate. After assembly, the legs 840 and/or the fingers 845 may contact at least three locations on the microconnector 810, and the fingers 845 may be configured such that one of these three or more contact locations is offset from the other contact locations relative to the first plane, the second plane, or both the first and second planes.

Taking all of the above into consideration, the present disclosure introduces an apparatus including at least one of a compliant handle and a deflectable connection member. The compliant handle may be configured to frictionally engage a manipulation probe. The deflectable connection member may have a first end coupled to the handle and a second end configured to deflect and thereby engage a receptacle by contacting at least three locations on the receptacle. At least one of the compliant handle, the deflectable connection member and the receptacle may have a thickness that is less than about 1000 microns.

The present disclosure also introduces an apparatus including at least three deflectable members each configured to deflect during assembly with a component and remain in contact with the component after assembly with the component. At least one of the deflectable members and the component may have a thickness not greater than about 1000 microns.

An embodiment of a method introduced in the present disclosure includes sliding a first member relative to a second member, wherein at least one of the first and second members is one of a plurality of deflectable members. Such a method also includes maintaining a relative orientation of the first and second members by contact between at least three of the plurality of deflectable members and one of the first and second members that is not part of the plurality of deflectable members.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a compliant handle configured to frictionally engage a manipulation probe; and
   a deflectable connection member having a first end coupled to the handle and a second end configured to deflect and thereby engage a receptacle by contacting at least three locations on the receptacle;
   wherein at least one of the compliant handle, the deflectable connection member and the receptacle have a thickness that is less than about 1000 microns.

2. The apparatus of claim 1 wherein the at least three locations is at least four locations.

3. The apparatus of claim 1 wherein at least one of the deflectable connection member and the receptacle includes at least three elongated, deflectable members each corresponding to one of the at least three locations.

4. The apparatus of claim 3 wherein at least two of the at least three elongated, deflectable members each include a barb.

5. The apparatus of claim 3 wherein:
   the second end of the deflectable connection member deflects in a first plane;
   the receptacle includes the at least three elongated, deflectable members;
   the at least three elongated, deflectable members each deflect in a second plane;
   the at least three locations include first, second and third locations; and
   the first location is offset from the second and third locations relative to each of the first and second planes.

6. The apparatus of claim 5 wherein the second plane is substantially perpendicular to the first plane.

7. An apparatus, comprising:
   at least three deflectable members each configured to:
      deflect during assembly with a component; and
      remain in contact with the component after assembly with the component;
   wherein at least one of the deflectable members and the component has a thickness not greater than about 1000 microns.

8. The apparatus of claim 7 wherein the each of the at least three deflectable members is an elongated member substantially greater in length and thickness than width.

9. The apparatus of claim 7 wherein the at least three deflectable members includes at least four deflectable members.

10. The apparatus of claim 7 wherein the at least three deflectable members includes two first deflectable members and two second deflectable members, the second deflectable members collectively interposing the two first deflectable members.

11. The apparatus of claim 10 wherein the two first deflectable members form first mirror-images and the two second deflectable members form second mirror-images.

12. The apparatus of claim 10 wherein each of the two second deflectable members have an outer profile substantially conforming to an inner profile of a corresponding one of the two first deflectable members.

13. The apparatus of claim 10 wherein, after assembly with the component, the two first deflectable members contact at least one of:
   a first surface of the component; and
   an edge of the first surface.

14. The apparatus of claim 13 wherein, after assembly with the component, the two second deflectable members contact at least one of:
   a second surface of the component; and
   an edge of the second surface.

15. The apparatus of claim 14 wherein the first and second surfaces have no common edge.

16. The apparatus of claim 14 wherein the first and second surfaces are located on substantially opposing sides of the component.

17. The apparatus of claim 7 further comprising the component.

18. The apparatus of claim 7 wherein the at least three deflectable members form a receptacle, wherein the receptacle is one of a plurality of receptacles, and wherein the apparatus is one of a plurality of apparatus each including a corresponding one of the plurality of receptacles.

19. A method, comprising:
   sliding a first member relative to a second member, wherein at least one of the first and second members is one of a plurality of deflectable members; and
   maintaining a relative orientation of the first and second members by contact between at least three of the plurality of deflectable members and one of the first and second members that is not part of the plurality of deflectable members;
   wherein a feature dimension not greater than about 1000 microns is a characteristic of at least one member selected from the group consisting of:
   the first member;
   the second member; and
   one of the plurality of deflectable members.

20. The method of claim 19 wherein the characteristic feature dimension is less than about 10 microns.

* * * * *